(12) United States Patent
Ahn

(10) Patent No.: US 10,468,582 B2
(45) Date of Patent: Nov. 5, 2019

(54) BASKETBALL WITH PIEZO ELEMENTS TO PRODUCE CHARGING CURRENT

(71) Applicant: Sunhoo Ahn, San Jose, CA (US)

(72) Inventor: Sunhoo Ahn, San Jose, CA (US)

( * ) Notice: Subject to any disclaimer, the term of this patent is extended or adjusted under 35 U.S.C. 154(b) by 101 days.

(21) Appl. No.: 15/913,925

(22) Filed: Mar. 7, 2018

(65) Prior Publication Data

US 2018/0198051 A1     Jul. 12, 2018

(51) Int. Cl.
| | |
|---|---|
| *A63B 69/00* | (2006.01) |
| *H01L 41/04* | (2006.01) |
| *H01L 41/08* | (2006.01) |
| *H02J 7/00* | (2006.01) |
| *H02M 7/28* | (2006.01) |

(52) U.S. Cl.
CPC ........ *H01L 41/042* (2013.01); *A63B 69/0071* (2013.01); *H01L 41/0825* (2013.01); *H02J 7/0052* (2013.01); *H02M 7/28* (2013.01)

(58) Field of Classification Search
CPC .................................................. A63B 69/0071
See application file for complete search history.

(56) References Cited

U.S. PATENT DOCUMENTS

| | | | | |
|---|---|---|---|---|
| 9,724,570 | B2 * | 8/2017 | Krysiak | G09B 19/0038 |
| 2005/0233815 | A1 * | 10/2005 | McCreary | A63B 24/0021 |
| | | | | 473/131 |
| 2008/0026886 | A1 * | 1/2008 | Vassilev | A63B 41/12 |
| | | | | 473/593 |
| 2013/0167290 | A1 * | 7/2013 | Ben Ezra | A63B 71/10 |
| | | | | 2/425 |
| 2014/0235379 | A1 * | 8/2014 | Nurnberg | A63B 43/004 |
| | | | | 473/570 |
| 2016/0155928 | A1 * | 6/2016 | Savelli | H01L 41/1132 |
| | | | | 310/318 |
| 2017/0133953 | A1 * | 5/2017 | Gross | H02N 2/181 |
| 2017/0368425 | A1 * | 12/2017 | Gordon | A63B 43/00 |

* cited by examiner

*Primary Examiner* — Charlie Y Peng

(57) ABSTRACT

A basketball that uses compression or decompression of piezo elements to produce current that charges a rechargeable battery in the basketball. The current is generated by the piezo elements that are placed between an inner shell and an outer shell of the basketball so that the bouncing of the basketball creates current to charge the battery. The charged battery can be coupled to an electronic device (e.g., smartphone) to charge the electronic device.

9 Claims, 6 Drawing Sheets

BASKETBALL WITH PIEZO ELEMENTS TO PRODUCE CHARGING CURRENT

BACKGROUND

Field

The present disclosure relates to a basketball having piezo elements that produce current to charge a rechargeable battery.

Description of Related Art

Portable electronic devices such as smartphone or tablets are becoming ubiquitous. When these devices are running low on power, they need to be charged using a charging device connected to an electrical outlet or a portable battery bank that is pre-charged. However, it is cumbersome to carry around charging devices or portable power banks. Moreover, electrical outlets may not be accessible at outdoor locations such as a basketball court, which makes the charging of the electronic devices more difficult.

SUMMARY

Embodiments relate to a basketball with at least one piezo element to provide charge current for charging a rechargeable battery included in the ball. The at least one piezo element is placed between an inner shell and an outer shell of the ball. The rechargeable battery is connected to the piezo elements and housed in the ball. The rechargeable battery is charged by current provided by the piezo element when the piezo element deforms due to external forces applied to the outer shell of the ball.

DETAILED DESCRIPTION

Embodiments relate to a basketball that uses compression or decompression of piezo elements to produce current to charge a rechargeable battery in the basketball. The current is generated by the piezo elements that are placed between an inner shell and an outer shell of the basketball so that the bouncing of the basketball creates current to charge the battery. The charged battery can provide current to an electronic device (e.g., smartphone) for charging the electronic device.

Balls may undergo elastic deformation when external force is applied but returns to its original shape after the external force is removed due to its resilience. A large portion of the energy stored in the deformed balls are wasted in the form of heat while the remaining energy is converted back to kinetic energy that causes the ball to bounce. Embodiments convert part of the energy stored in the deformed balls into electrical power using piezo elements and stores the electrical power in a rechargeable battery for later use. The scheme of using the piezo elements is especially effective, but not limited to, balls that experience repeated and frequent deformation during play such as basketballs.

Figure 1:
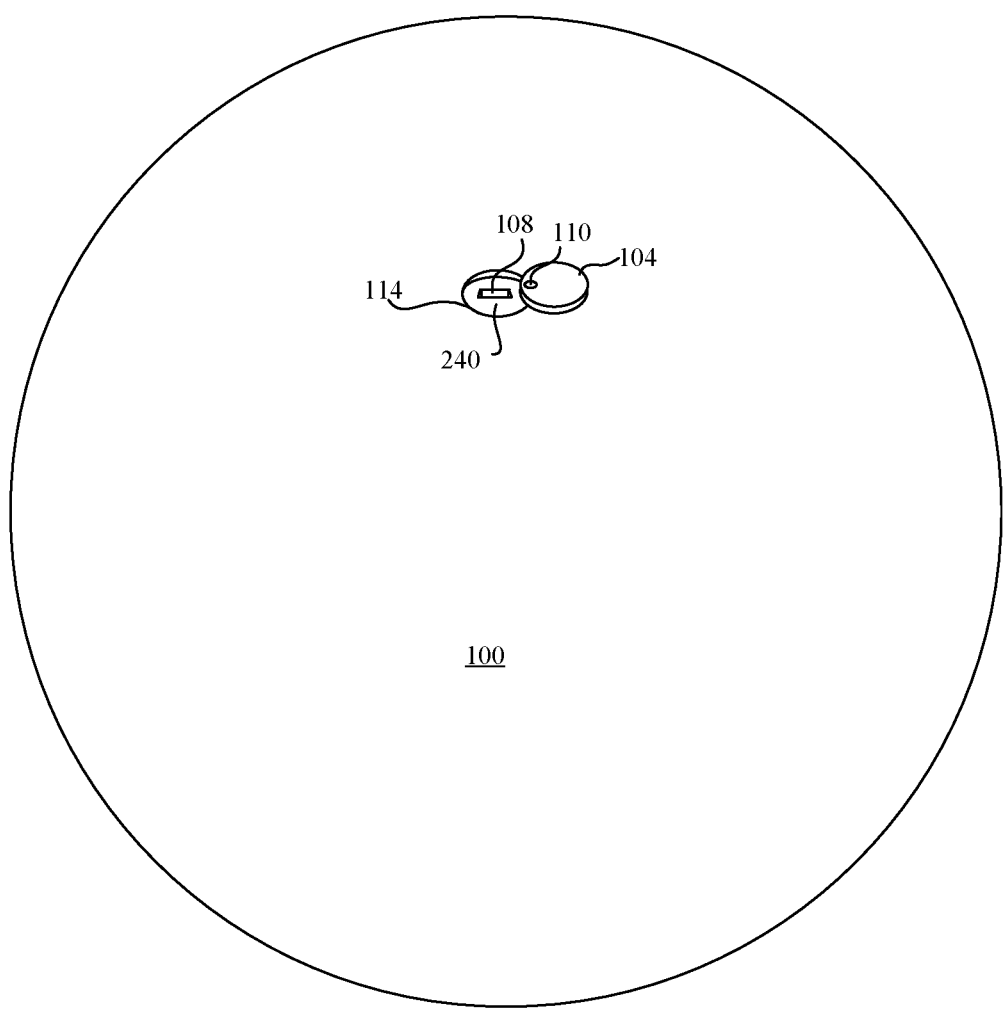
FIG. 1 is a perspective view of a basketball with a recharging terminal, according to one embodiment.

FIG. 1 is a perspective view of a basketball 100 with a recharging terminal 108, according to one embodiment. The basketball 100 includes a circuit module 240 that can be accessed by opening a cover 104 attached to an outer shell 210 of the basketball 100. The circuit module 240 is received in a cylindrical hole 114 of the basketball 100 and includes a terminal 108 (e.g., USB terminal) that can be connected to an electronic device (not shown) to charge the electronic device using power stored in a rechargeable battery, as described below in detail with reference to FIG. 5.

In one embodiment, the cover 104 is attached to the outer shell 210 of the basketball 100 via a hinge 110. When the cover 104 is closed, the outer surface of the cover 104 may be flush with the outer surface of the outer shell 210 so that it does not interfere with the bouncing of the basketball 100. In order to open the cover 104, the cover 104 may be pulled out and then rotated around the hinge 110. The cover and the receiving holes 114 may also be formed with protrusions or grooves to more securely fix the cover 104 to the hole 114.

Figure 2:
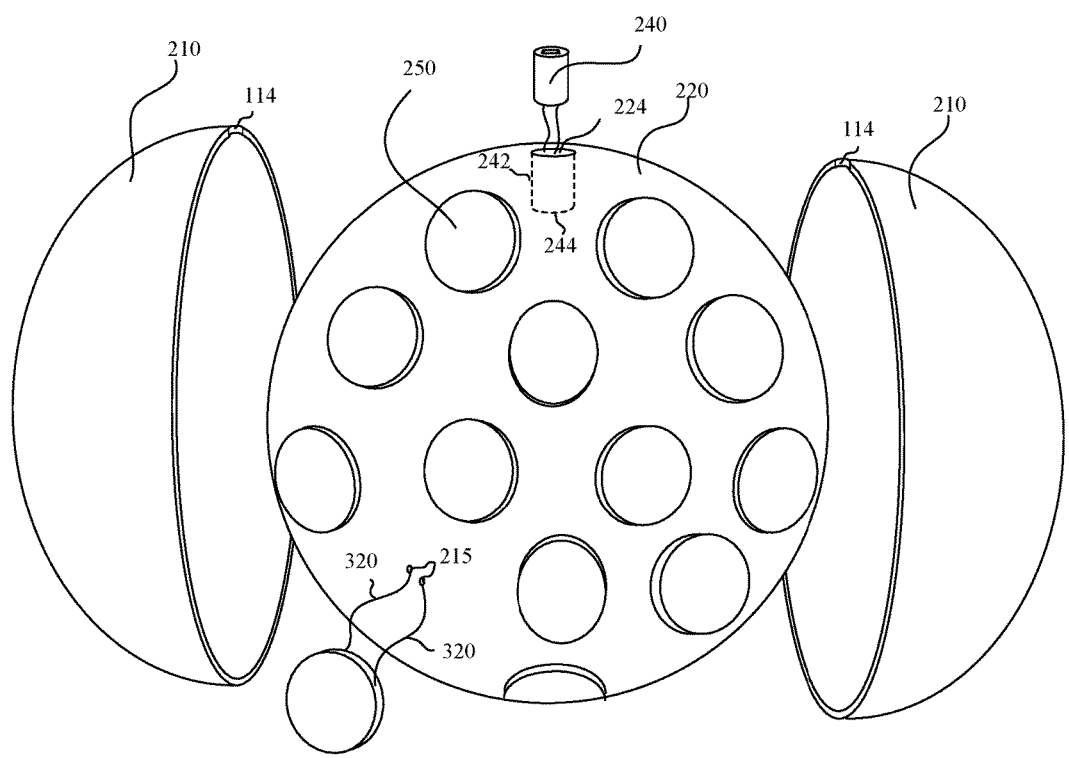
FIG. 2 is an exploded perspective view of the basketball, according to one embodiment.

FIG. 2 is an exploded perspective view of the basketball 100, according to one embodiment. The basketball 100 may include, among other components, the outer shell 210, the inner shell 220, a circuit module 240, piezo elements 250 between the inner shell 220 and the outer shell 210. The inner shell 220 is formed with a hole 224 that is aligned with the cylindrical hole 114 to receive the circuit module 240. The hole 224 may have side wall 242 and 244 that may prevent air inside the inner shell 220 from leaking.

The circuit module 240 is formed with a unitary body that includes various components, for example, as described below in detail with reference to FIG. 5. In one embodiment, the circuit module 240 may be removed from the basketball 100 and be replaced with a new module in a convenient manner.

The piezo elements 250 are placed between the inner shell 220 and the outer shell 210. Electrical wires 320 may be inserted into the inner shell 220 via through-holes 215 formed in the inner shell 220. The electrical wires 320 of each piezo elements are connected to input terminals N1, N2 of the circuit module 240, as described below in detail with reference to FIG. 5.

The piezo elements 250 may be shaped in circles and dispersed on the inner shell 220 with the same distance from each other. The piezo elements 250 may be in other shapes and be placed in patterns than what is illustrated in FIG. 2. The piezo elements 250 may be attached to the inner shell 220 via a glue. Alternatively, the piezo elements 250 may be placed inside a mold into which liquid resin forming the inner shell 220 is injected. As the resin solidifies, the piezo elements 250 become secured to the inner shell 220.

Figure 3:
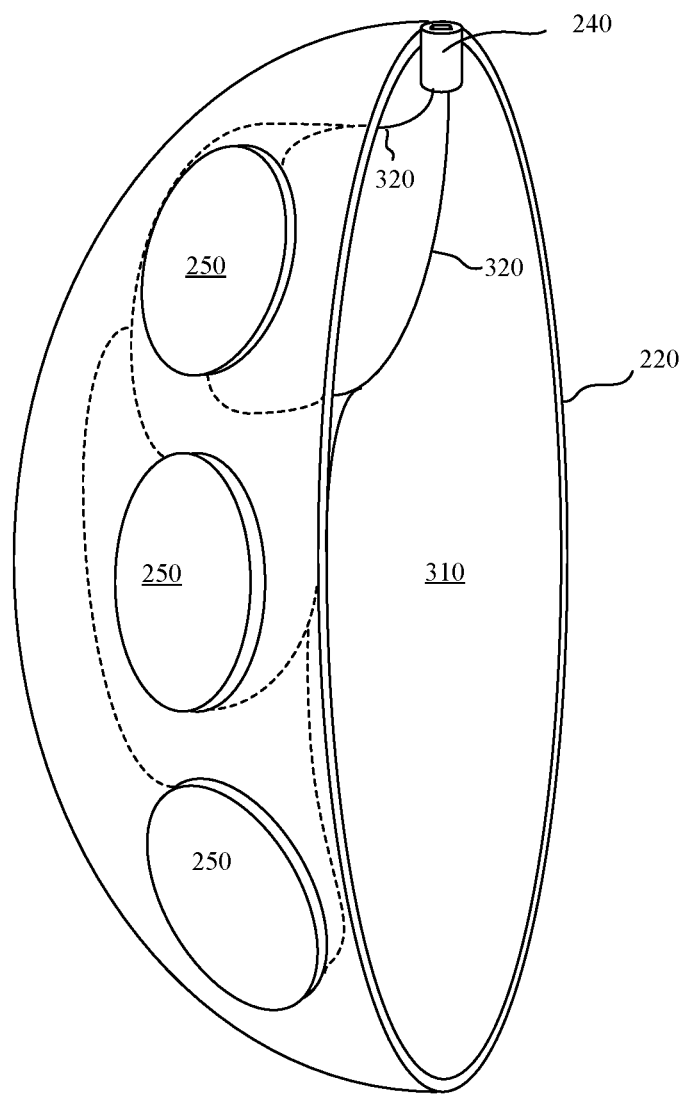
FIG. 3 is an exploded perspective view of an inner shell of the basketball, according to one embodiment.

FIG. 3 is an exploded perspective view of the inner shell 220 of the basketball 100, according to one embodiment. Each of the piezo elements 250 may have two electrical wires extending to the circuit module 240. In one embodiments, the electrical wires of the same polarity are connected to common wires and then the common wires are connected to the input terminals N1, N2. In one embodiment, at least part of the electrical wires 320 or the common wires extend through a center void 310 of the inner shell 220.

Figure 4A:
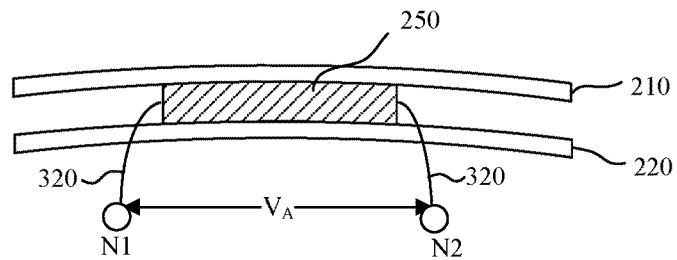
FIG. 4A is a cross sectional view of a piezo element placed between an outer shell and the inner shell of the basketball in an uncompressed state, according to one embodiment.

FIG. 4A is a cross sectional view of a piezo element 250 placed between the outer shell 210 and the inner shell 220 of the basketball 100 in an uncompressed state, according to one embodiment. The voltage between two output nodes of the piezo element is represented as $V_A$, which may be 0 when the piezo element 250 is in a neutral state.

Figure 4B:
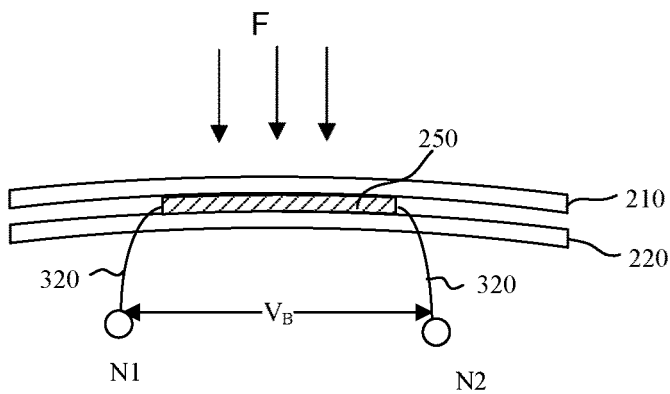
FIG. 4B is a cross sectional view of the piezo element of FIG. 4A in a compressed state, according to one embodiment.

FIG. 4B is a cross sectional view of the piezo element 250 of FIG. 4A in a compressed state, according to one embodiment. When force F is applied to the outer shell 210 (e.g., when the basketball 100 hits the floor or backboard), the piezo element 250 is compressed. This causes the voltage $V_B$ between the two output nodes of the piezo element 250 to take a positive or negative value.

In one embodiment, the inner shell 220 is made of a material that is more rigid than the material of the outer shell 210. In this way, the inner shell 220 will deform to a less degree compared to the outer shell 210, causing the piezo element 250 to undergo more extensive deformation (i.e., compression). More deformation will cause the piezo element 250 to generate higher voltage difference across the nodes N1, N2, and higher current.

Figure 4C:
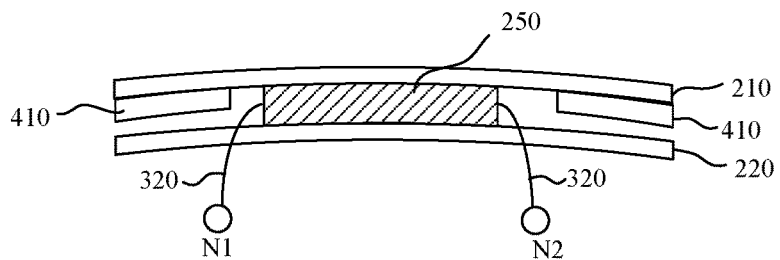
FIGS. 4C and 4D are cross sectional views of basketballs with support walls, according to embodiments.

FIG. 4C is a cross sectional view of the basketball 100, according to another embodiment. The embodiment of FIG. 4C is identical to the embodiment of FIG. 4A except that support walls 410 are formed in the interior surface of the outer shell 210 around the piezo element 250. The support wall 410 prevents the distance between the outer shell 210 and the inner shell 220 from becoming excessively small. In this way, excessive compression of the piezo element 250, which may damage the piezo elements, may be prevented.

Figure 4D:
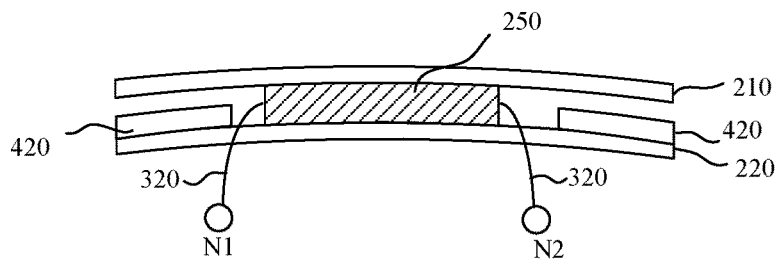

FIG. 4D is a cross sectional view of the basketball 100, according to yet another embodiment. The embodiment of FIG. 4D is identical to the embodiment of FIG. 4C except that support walls 420 are formed on the outer surface of the inner shell 220 instead of the interior surface of the outer shell 210. The support wall 420 prevents the distance between the outer shell 210 and the inner shell 220 from becoming excessively small. In this way, excessive compression of the piezo element 250, which may damage the piezo elements, may be prevented.

Figure 5:
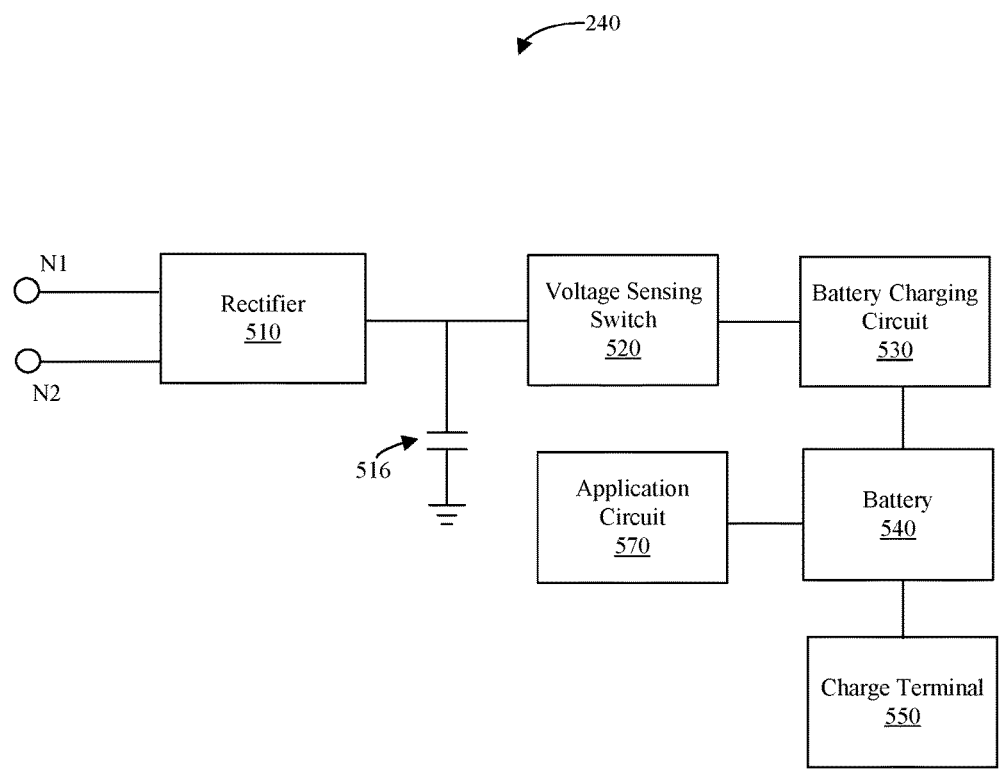
FIG. 5 is a block diagram of a circuit module, according to one embodiment.

FIG. 5 is a block diagram of the circuit module 240 inserted into the basketball 100, according to one embodiment. The circuit module 240 may include, among other components, a rectifier 510, a capacitor 516, a voltage sensing switch 520, a battery charging circuit 530, the rechargeable battery 540, a charge terminal 550, and an application circuit 570. One or more of these components may be omitted or be combined with other modules.

The rectifier 510 is a circuit that converts alternating current (AC) received from the piezo elements 250 through nodes N1, N2 into direct current (DC). The current received from the piezo elements 250 through the nodes N1, N2 are typically in the form of AC. The rectifier 510 may include interconnected diodes that enable the rectifier 510 to produce a DC output to the voltage sensing switch 520. The capacitor 516 smoothens the output DC produced by the rectifier 510.

The voltage sensing switch 520 is switched on when a voltage is detected in a line between the voltage sensing switch 520 and the rectifier 510. When the switch 520 is turned on, the battery charging circuit 530 is provided with the smoothed version of the output DC for charging the battery 540. Various schemes may be adopted by the battery charging circuit 530 to efficiently charge the rechargeable battery 540 and/or provide safety measures against overcharge of the rechargeable battery 540. For example, the battery charging circuit 530 may monitor the level of power remaining in the rechargeable battery 540 and/or the current or voltage level of a signal provided from the voltage sensing switch 520 to connect or disconnect the rechargeable battery 540. Further, the battery charging circuit 530 may modulate the charge signal to a predetermined pattern to more efficiently charge the battery 540.

The charge terminal 550 is connected to the battery 540 and interfaces with an electronic device (not shown) to be charged. The charge terminal 550 may be embodied as a USB terminal 108, as illustrated in FIG. 1.

The application circuit 570 is a circuit that monitors various activities associated with the basketball 100. The application circuit 570 may include, for example, an embedded processor, sensors and a wireless communication module. The application circuit 570 may use the power provided by the battery 540 to detect, for example, the time during which the basketball 100 was played with and estimate the accuracy of shots. The monitored result may be sent to a user via wireless communication (e.g., Bluetooth or WiFi).

Figure 6:
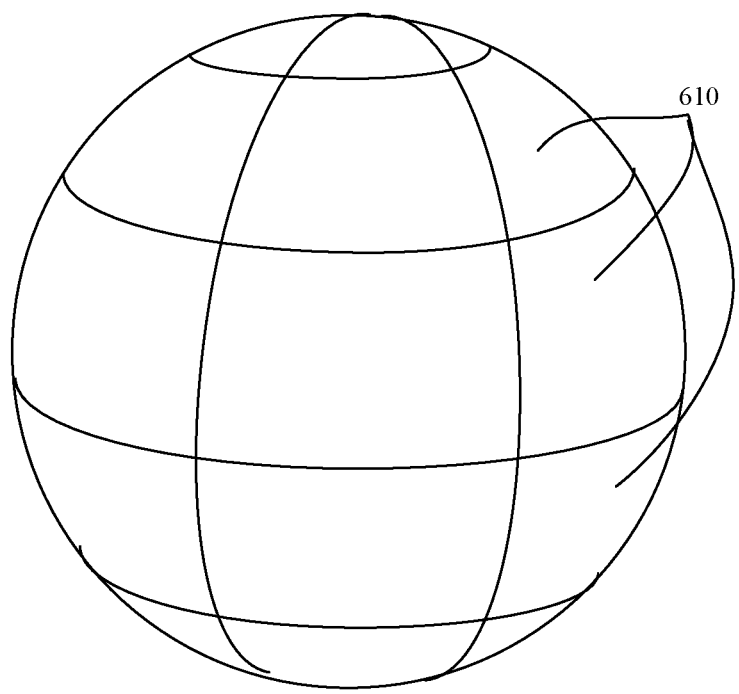
FIG. 6 a perspective view of piezo elements covering an inner shell of a basketball, according to one embodiment.

FIG. 6 a perspective view of piezo elements 610 covering an inner shell of a basketball, according to one embodiment. As illustrated in FIG. 6, the piezo elements 610 covers substantially the entire surface of the inner shell. In this way, the amount of electric power generated by the basketball can be increased. The piezo elements 610 may be of various shapes and dimensions.

Although various embodiments are described above, these are merely examples and do not limit the present invention. Various modification may be made without departing from the principles described herein.

What is claimed is:

1. A ball comprising:
an inner shell formed with a first hole;
an outer shell surrounding the inner shell and formed with a second hole;
at least one piezo element between the inner shell and the outer shell;
a circuit module including a rechargeable battery connected to the at least one piezo elements and housed in the ball, the rechargeable battery configured to be charged by current provided by the piezo element responsive to deformation of the piezo element due to external forces applied to the outer shell, wherein the circuit module is received in the first hole and the second hole; and
a cover hinged to the outer shell to expose or cover the circuit module.

2. The ball of claim 1, further comprising: a rectifier having input nodes connected to the at least one piezo element; and a charging circuit between the rectifier and the rechargeable battery to provide current or shut off current to the rechargeable battery.

3. The ball of claim 2, further comprising an application circuit coupled to the rechargeable battery to monitor activities associated with the ball.

4. The ball of claim 3, wherein the rechargeable battery, the rectifier, the charging circuit and the application circuit are housed in a single body.

5. The ball of claim 1, further comprising a charge terminal connected to the rechargeable battery to interface with an external electronic device for charging the external electronic device.

6. The ball of claim 5, wherein the charge terminal includes a USB terminal.

7. The ball of claim 1, wherein the inner shell is attached with a support wall surrounding the at least one piezo element to protect the at least one piezo element.

8. The ball of claim 1, wherein the outer shell is attached with a support wall surrounding the at least one piezo element to protect the at least one piezo element.

9. The ball of claim 1, wherein the ball is a basketball and the external forces are applied by bouncing the ball on a floor or a backboard.

\* \* \* \* \*